(12) United States Patent  
Su et al.

(10) Patent No.: US 7,030,557 B2
(45) Date of Patent: Apr. 18, 2006

(54) DISPLAY DEVICE WITH PASSIVATION STRUCTURE

(75) Inventors: Chih-Hung Su, Hsin-Chu (TW); Ta-Chin Wei, Chung-Li (TW)

(73) Assignee: AU Optronics Corp., Hsin-Chu (TW)

( * ) Notice: Subject to any disclaimer, the term of this patent is extended or adjusted under 35 U.S.C. 154(b) by 165 days.

(21) Appl. No.: 10/707,932

(22) Filed: Jan. 26, 2004

(65) Prior Publication Data

US 2004/0145310 A1    Jul. 29, 2004

(30) Foreign Application Priority Data

Jan. 29, 2003    (TW) ............... 92102075 A

(51) Int. Cl.
*H05B 33/00* (2006.01)
*H01J 63/04* (2006.01)

(52) U.S. Cl. .................. 313/506; 313/504; 313/509; 313/512

(58) Field of Classification Search ............. 313/512, 313/503, 504, 506, 509
See application file for complete search history.

(56) References Cited

U.S. PATENT DOCUMENTS

| | | | | |
|---|---|---|---|---|
| 5,739,545 A | * | 4/1998 | Guha et al. | 257/40 |
| 6,344,884 B1 | * | 2/2002 | Kim et al. | 349/43 |
| 6,570,325 B1 | * | 5/2003 | Graff et al. | 313/506 |
| 6,849,877 B1 | * | 2/2005 | Yamazaki et al. | 257/86 |
| 2001/0043043 A1 | * | 11/2001 | Aoyama et al. | 313/506 |

* cited by examiner

*Primary Examiner*—Ashok Patel
*Assistant Examiner*—Bumsuk Won
(74) *Attorney, Agent, or Firm*—Winston Hsu

(57) ABSTRACT

A display device includes a substrate, a display unit disposed on the substrate, and a passivation structure covering the substrate and the display unit. The passivation structure is composed of an organic/inorganic film. An inner side of the organic/inorganic film, which is closer to the display unit, has a maximum organic/inorganic ratio which gradually decreases outward.

11 Claims, 3 Drawing Sheets

DISPLAY DEVICE WITH PASSIVATION STRUCTURE

BACKGROUND OF INVENTION

1. Field of the Invention

The present invention relates to a passivation structure of a display device, and more particularly, to a passivation structure formed of an organic/inorganic film.

2. Description of the Prior Art

The progress of science and technology has led to organic materials being well applied to all kinds of electrical devices. For example, organic light-emitting displays (OLEDs), which are formed by using organic materials, have the advantages of simpler structures, excellent operating temperature, high contrast, and a wide viewing angle, and have the beneficial characteristics of light-emitting diodes (LEDs), such as rectification and luminosity, so as to be used extensively in the field of display devices. Since the OLED uses luminous devices formed of organic materials to provide a light source, the OLED is very sensitive to the moisture. Once the organic light-emitting devices are exposed in the moisture, the cathode thereon may be oxidized and the interface of organic compounds may be peeled. This leads to dark spots being generated in the luminous devices, which deteriorates the brightness and the lifetime of the display devices. As a result, the package material used to package the electrical devices not only needs high anti-abrasiveness and thermal conductivity, but also requires low moisture permeability to prevent the organic materials from being exposed in the external environment effectively and to improve the lifetime of the electrical devices.

For example, in the conventional package process of display devices, a sealing agent made of polymer materials is often used to combine the container, which is composed of a metal or glass material, with the substrate and a desiccant agent and dry nitrogen are filled into the empty region there between. However, this package structure can be only applied to the display devices with metal or glass substrates, but cannot be used in packaging those with the flexible substrates. In addition, the metal container has disadvantages of having a heavy weight, and being oxidized easily. In the fabricating process, the metal container also has disadvantages of pealing off from the glass materials easily and having the requirement of a high degree of flatness. The glass container has the disadvantages of having heavy weight, cracking easily, and pealing off easily due to stress differences. Moreover, most of the sealing agents composed of polymer materials lack adequate protection from moisture. As a result, although the electrical devices are packaged, the moisture of the external environment still permeates into the packaged device gradually and erodes the display devices so as to deteriorate the display effect and decrease the lifetime of the display devices.

In order to solve the above-mentioned problems of the metal or glass container, a new passivation process that utilizes films to encapsulate the protected devices is developed. Please refer to FIG. 1, which is a cross-sectional diagram of a passivation structure 16 disclosed in U.S. Pat. No. 5,811,177. As shown in FIG. 1, an OLED 10 mainly comprises a substrate 12, a display unit 14 positioned on the substrate 12, and a passivation structure 16 covering the display unit 14 and the substrate 12. The display unit 14 is composed of a plurality of pixels and further comprises a driving circuit (not shown) disposed on the substrate 12 for driving the pixels to display. The passivation structure 16, which is a multiple film structure, comprises a metal layer 18, a buffer layer 20, a thermal coefficient matching layer 22, a low permeability layer 24, and a sealing layer 26 stacked on the display unit 14 in sequence for protecting the display unit 14.

Furthermore, another passivation structure which utilizes a metal layer, inorganic materials and hydrophobic polymer materials is disclosed in U.S. Pat. No. 5,952,778. Another moisture-proof multi-layer structure is disclosed in Chinese Taipei Patent 379,531 to improve the above-mentioned problem. The structure includes a moisture-adsorbing resin layer, an adhesive layer, and a transparent resin layer and covers an electroluminescent device to prevent the electroluminescent device from moistening and oxidizing.

As mentioned above, although most inorganic materials have a superior water repelling ability, the inorganic materials have a significant difference from the organic light emitting display unit, which is almost formed of organic materials, in the stress or the thermal expansion coefficient. The adhesion between the inorganic materials and the organic materials is also weak so that the inorganic materials are easily peeled from the organic light emitting display unit. As a result, though the conventional passivation structures have different package design or package materials, they typically utilize a polymer material as a buffer layer and stack the buffer layers and the inorganic materials in a staggered layout on the display unit to form an multi-layer passivation structure to prevent electrode materials or organic materials in the display device from being eroded or oxidized by the moisture and oxygen in the external environment. Normally, some moisture sensitive electrical devices, such as the OLED, require a passivation whose permeability is less than 0.05 $g/m^2$ day. Thus, most of the conventional passivation structures are composed of more than five stacked layers to meet the permeability requirement. However, although the multilayer structure can provide a better effect on moisture protection, there is the disadvantage of complicated fabricating process which leads to a high fabrication cost and long fabricating time.

Additionally, since the passivation structure 16 on the display unit is usually opaque, the organic light emitting display device has to use the transparent substrate beneath to display images in a bottom emission mode. When the size of the display device increases and the resolution thereof improves, the display device operates in an active driving method instead of the conventional passive driving method. In an active organic light emitting display device, each pixel needs an independent driving circuit so that more electrical devices are required and more area is occupied thereby. This leads to a decrease in the ratio of transmitting area in each pixel. As a result, when light beams generated from the organic light emitting display device pass downward through the transparent substrate to display images, some light beams are blocked by the driving circuit in each pixel so that the brightness of the organic light emitting display device is reduced and the display performance is therefore deteriorated. Thus, it is important to develop a new passivation structure and method thereof to solve the aforementioned problem.

SUMMARY OF INVENTION

It is therefore a primary objective of the claimed invention to provide a passivation structure which comprises an organic/inorganic film to solve the problem mentioned above.

In a preferred embodiment of the claimed invention, a display device comprises a substrate, a display unit disposed on the substrate, and a passivation structure covering the display unit and the substrate. The passivation structure is formed of an organic/inorganic film. An inner side, which is closer to the display unit, of the passivation structure has a higher organic/inorganic ratio than an outer side, which is farther from the display unit, and the organic/inorganic ratio gradually decreases from the inner side of the passivation structure toward the outer side of the passivation structure.

It is an advantage of the claimed invention that the passivation structure is formed of a single organic/inorganic film. Thus, the fabricating process can be simplified significantly. By adjusting the organic/inorganic ratio properly, the passivation structure has the characteristic of the organic materials and the inorganic material at the same time so as to attach on the display unit perfectly and has an excellent water repelling ability to prevent the display unit beneath from being damaged by the moisture, oxygen, or other gases.

These and other objectives of the claimed invention will not doubt become obvious to those of ordinary skill in the art after reading the following detailed description of the preferred embodiment, which is illustrated in the various figures and drawings.

DETAILED DESCRIPTION

Figure 1:
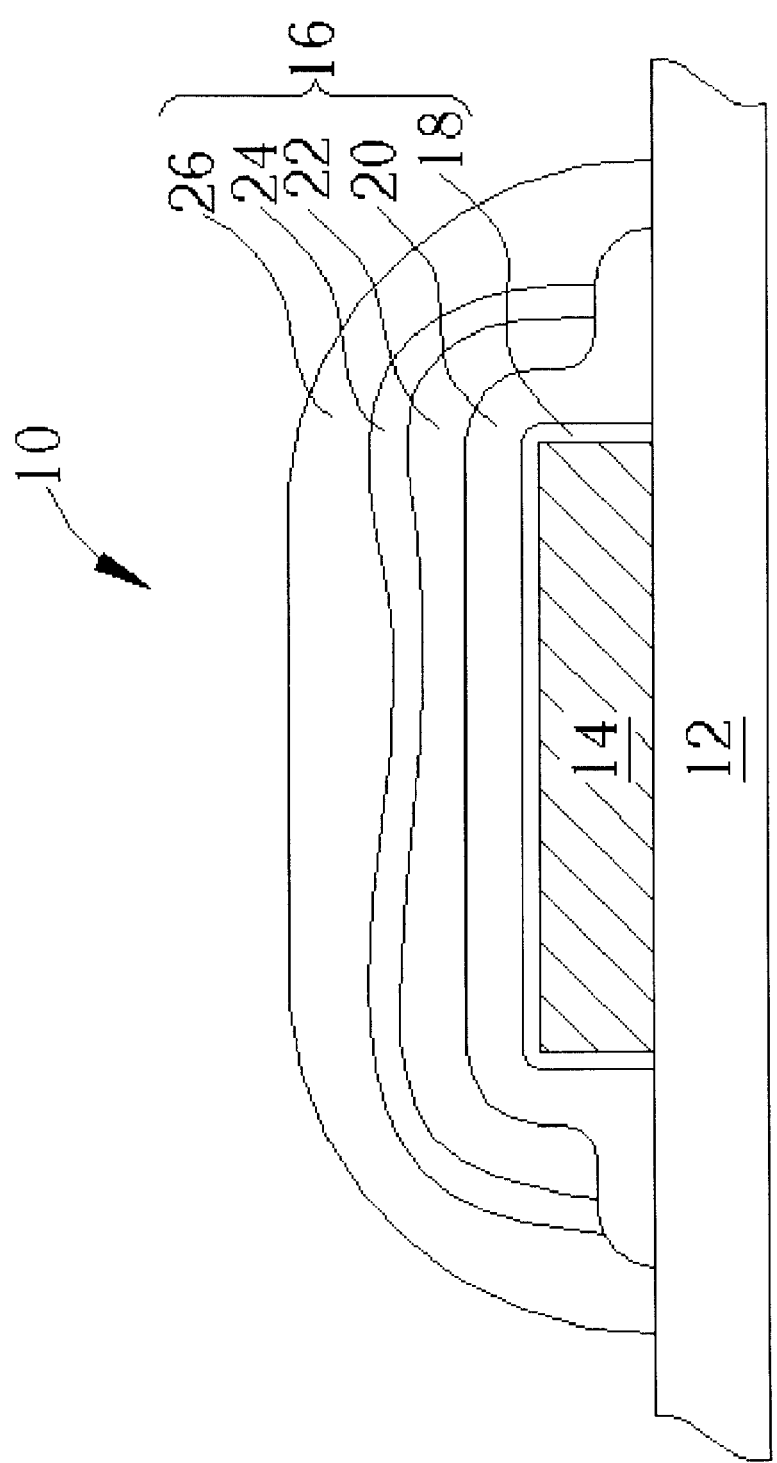
FIG. 1 is a schematic diagram of a passivation structure according to prior art.
Figure 2:
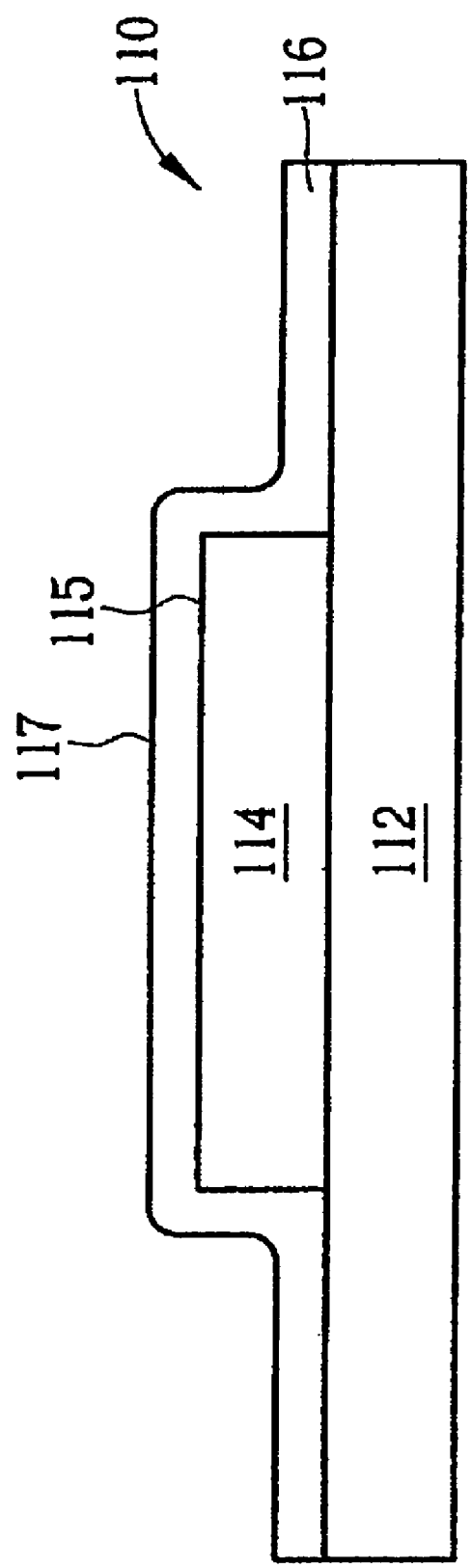
FIG. 2 is a schematic diagram of a display device according to a preferred embodiment of the present invention.

Please refer to FIG. 2, which is a schematic diagram of a display device 110 of a preferred embodiment of the present invention. As shown in FIG. 2, the display device 110 comprises a substrate 112, a display unit 114 positioned on the surface of the substrate 112, and a passivation structure 116 covering the display unit 114 and the substrate 112 for preventing the display unit 114 from being exposed to the external atmosphere.

Figure 3:
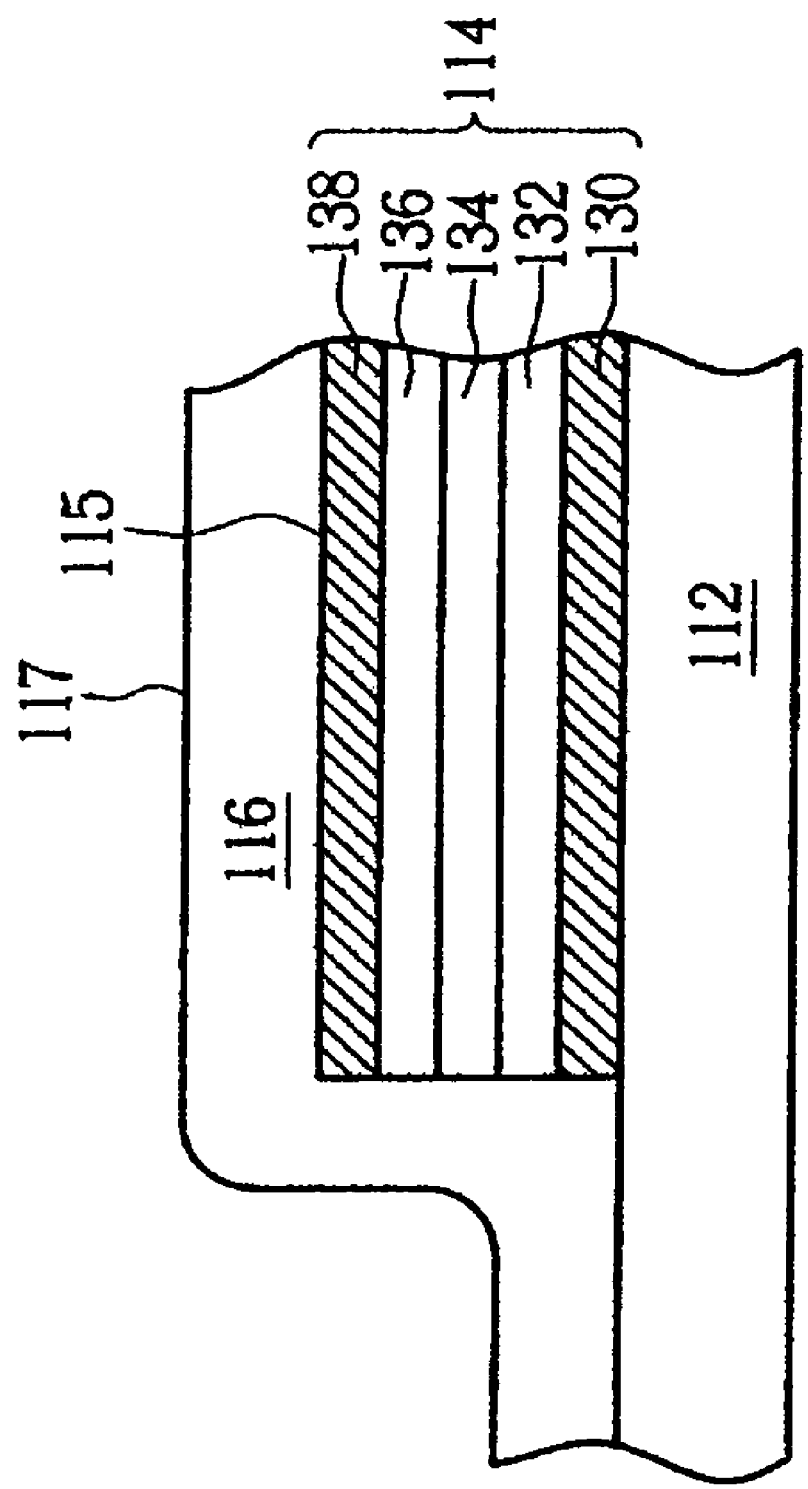
FIG. 3 is a local amplified diagram of the display device shown in FIG. 2.

Please refer to FIG. 3, which is a local amplified schematic diagram of the display device 110. As shown in FIG. 3, the display unit 114 is composed of a plurality of pixels. Each pixel is a multi-layer stacked structure and comprises a conductive layer 130, a luminous layer 132, a metal layer 134, a dielectric layer 136, and a conductive layer 138 stacked on the substrate 112 in sequence. In the preferred embodiment of the present invention, the display device 110 is an organic light emitting display device. The luminous layer 132 is primarily formed of organic materials, such as an organic luminous layer composed of conjugated polymers. The substrate 112 is a glass substrate, a plastic substrate, or a metal substrate. The conductive layers 130 and 138 are usually composed of ITO or IZO. The metal layer 134 comprises alloys of Al—Mg, Al—Li, or Al—LiF. The dielectric layer 136 comprises a silicon nitride layer, a silicon oxide layer, or a polymer layer. In addition, the display unit 114 further comprises an active driving circuit comprising a plurality of thin film transistors arranged in a matrix form for driving the pixels in the display device 110 with an active driving method to display images.

The passivation structure 116 is made of an organic/inorganic film. By changing the ratio between the sources of the organic compounds and the inorganic compounds continuously in the fabricating process, the formed organic/inorganic film has a higher organic/inorganic ratio in inner side 115, which is closer to the display unit 114, of the passivation structure 116 than that in an outer side 117, which is farther from the display unit 114, and the organic/inorganic ratio gradually decreases from the inner side 115 of the passivation structure 116 toward the outer side 117 of the passivation structure 116.

For example, in the preferred embodiment of the present invention, trimethylchlorosilane (TMCS) or hexamethyldisilazane (HMDS) is used as the gas source to perform a plasma enhanced chemical vapor deposition with an oxygen plasma and thereby produce an organic/inorganic film formed of a $SiO_xC_yH_z$ compound covering the display unit 114 and the substrate 112. In the fabricating process, different methods can be used to control the ratio among x, y, and z so that the $SiO_xC_yH_z$ compound formed earlier has a higher organic/inorganic ratio, which has a higher y and z, and the organic/inorganic ratio is decreasing gradually, in which y and z are smaller, in the latter fabrication. Therefore, the inner side 115 closer to the display unit 114 of the passivation structure 116 has a similar property to the organic materials so that a better attachment and a thermal expansion coefficient and stress, which are corresponding to the display unit 114, can be obtained. The outer side of the passivation structure 116, which is farther from the display unit 114, has a lower organic/inorganic ratio and thereby has a high water repelling ability, which is similar to the inorganic materials. It is important that the passivation structure 116 is not only fabricated by the aforementioned PECVD process but also can be formed in other processes, such as a sputtering process. In addition, though the $SiO_xC_yH_z$ compound is disclosed in the previous embodiment, however, the organic/inorganic film can also be composed of other materials, such as $SiN_xC_yH_z$, or $SiO_wN_xC_yH_z$ compounds.

It is noted that the organic/inorganic film in the present invention not only has the characteristics of organic materials and inorganic materials simultaneously but also has a high transmittance in a range of 40 to 90% by using suitable materials and controlling the fabricating parameter properly. Consequently, the organic light emitting display device 110 can not only display in a bottom emission mode through the glass substrate 112 but also display in a top emission mode through the passivation structure 116 composed of the high transmittance organic/inorganic film at the same time. Thus, the display performance is not affected by the electrical devices positioned on the surface of the substrate 112 so as to overcome the problem in the prior art caused by a high density of electrical devices.

Furthermore, although the passivation structure in the aforementioned embodiment is used in a field of the package of the organic light emitting display device, the present invention is not limited therein. According to the above description and illustration, one skilled in the art can easily apply the passivation structure disclosed in the present invention to other electric devices, which are sensitive to moisture, to obtain a better package performance and lengthen the lifetime of the electric devices.

In contrast with the prior art, the passivation structure in the present invention is formed of an organic/inorganic film. By controlling the organic/inorganic ratio of the organic/inorganic film in the fabricating process, the passivation structure can have characteristics of both organic materials and inorganic materials. It means that the passivation structure can have a stress and thermal expansion coefficient matching with the organic light emitting display unit and have a high water repelling ability as the inorganic materials so as to provide an excellent package performance and achieve the purpose of improving the display performance and lengthening the lifetime of the electrical devices. In addition, by choosing suitable materials of the organic/inorganic film, a high transmittance passivation structure can be made. Thus, a top emission mode can be used in display images to overcome the low display performance problem in the prior art caused by the high dense of electrical devices. Furthermore, comparing with the prior art passivation structure which is a multi-layer stacked structure, the passivation structure is a single layer structure and can be formed in a single process. Therefore, it not only solves the peeling problem occurring in the interfaces between different materials, but also simplifies the fabricating process, leading to lowering the manufacturing cost, reducing the fabricating time, and improving the capacity thereby.

Those skilled in the art will readily observe that numerous modifications and alterations of the invention may be made while retaining the teachings of the invention. Accordingly, the above disclosure should be construed as limited only by the metes and bounds of appended claims.

The invention claimed is:

1. A display device comprising:
 a substrate;
 a display unit disposed on the substrate; and
 a passivation structure formed of an organic/inorganic film covering the display unit and the substrate;
 wherein an inner side, which is closer to the display unit, of the passivation structure has a higher organic/inorganic ratio than an outer side, which is farther from the display unit, and the organic/inorganic ratio gradually decreases from the inner side of the passivation structure toward the outer side of the passivation structure.

2. The display device of claim 1 wherein the display device is an organic light emitting display device.

3. The display device of claim 1 wherein the display unit is an organic light emitting display unit comprising an organic luminous layer composed of organic materials.

4. The display device of claim 1 wherein the inner side of the passivation structure has a higher organic/inorganic ratio to increase adhesion between the passivation structure and the display unit.

5. The display device of claim 1 wherein the outer side of the passivation structure has a lower organic/inorganic ratio to improve water repelling ability of the passivation structure.

6. The display device of claim 1 wherein the organic/inorganic film comprises materials composed of $SiO_xC_yH_z$, $SiN_xC_yH_z$, or $SiO_wN_xC_yH_z$ compounds.

7. The display device of claim 1 wherein a thickness of the passivation structure is in a range of 500 to 5000 angstroms.

8. The display device of claim 1 wherein the substrate is a glass substrate.

9. The display device of claim 1 wherein a transmittance of the passivation structure is in a range of 40 to 90%.

10. The display device of claim 9 wherein the light generated from the display unit transmits upward and passes through the passivation structure to display in a top emission mode.

11. The display device of claim 10 wherein the display device can display in a top emission and a bottom emission mode simultaneously.

* * * * *